US012717486B2

(12) United States Patent
Balakrishnan

(10) Patent No.: US 12,717,486 B2
(45) Date of Patent: Aug. 25, 2026

(54) MEMORY CONTROLLER FOR MEMORY WITH MEDIUM GRANULARITY REFRESH COMMANDS

(71) Applicant: Advanced Micro Devices, Inc., Santa Clara, CA (US)

(72) Inventor: Kedarnath Balakrishnan, Bangalore (IN)

(73) Assignee: Advanced Micro Devices, Inc., Santa Clara, CA (US)

(*) Notice: Subject to any disclaimer, the term of this patent is extended or adjusted under 35 U.S.C. 154(b) by 0 days.

(21) Appl. No.: 19/000,151

(22) Filed: Dec. 23, 2024

(65) Prior Publication Data

US 2026/0023482 A1 Jan. 22, 2026

Related U.S. Application Data

(60) Provisional application No. 63/672,971, filed on Jul. 18, 2024.

(51) Int. Cl.
*G06F 3/06* (2006.01)
*G11C 11/406* (2006.01)

(52) U.S. Cl.
CPC .......... *G06F 3/0611* (2013.01); *G06F 3/0659* (2013.01); *G06F 3/0673* (2013.01); *G11C 11/406* (2013.01)

(58) Field of Classification Search
CPC .... G06F 3/0611; G06F 3/0659; G06F 3/0673; G11C 11/406
See application file for complete search history.

(56) References Cited

U.S. PATENT DOCUMENTS

| | | | | |
|---|---|---|---|---|
| 9,576,637 | B1 | 2/2017 | Balakrishnan | |
| 10,109,340 | B2 | 10/2018 | Bains et al. | |
| 10,318,187 | B2 * | 6/2019 | Park | G06F 3/0619 |
| 10,593,392 | B1 * | 3/2020 | Johnson | G11C 8/10 |
| 11,100,974 | B2 | 8/2021 | Lee | |
| 2006/0004955 | A1 * | 1/2006 | Ware | G11C 11/406 365/222 |
| 2017/0364469 | A1 * | 12/2017 | Crisp | G11C 11/4093 |
| 2020/0020384 | A1 | 1/2020 | Zhao et al. | |
| 2024/0211173 | A1 * | 6/2024 | Balakrishnan | G06F 3/0659 |
| 2025/0104758 | A1 * | 3/2025 | Sethi | G11C 11/40626 |

OTHER PUBLICATIONS

Action on the Merits by U.S.P.T.O regarding U.S. Appl. No. 18/899,639, filed Sep. 27, 2024.

* cited by examiner

*Primary Examiner* — Sean D Rossiter
(74) *Attorney, Agent, or Firm* — Polansky & Associates, P.L.L.C.; Paul J. Polansky

(57) ABSTRACT

A data processor includes a memory accessing agent for generating memory access requests for a memory that includes a plurality of banks, and a memory controller. The memory controller includes a command queue and a refresh controller. The command queue is for storing the memory access requests. The refresh controller is coupled to the command queue and is operable to select an order of providing multi-bank refresh commands to sets of selected banks of the plurality of banks in the memory in response to lowest-cost estimates of the banks of the memory based on the memory access requests in the command queue.

17 Claims, 4 Drawing Sheets

MEMORY CONTROLLER FOR MEMORY WITH MEDIUM GRANULARITY REFRESH COMMANDS

CROSS REFERENCE TO RELATED APPLICATION

This application claims priority to provisional application U.S. 63/672,971, filed Jul. 18, 2024, the entire contents of which are incorporated herein by reference.

Related subject matter is found in U.S. patent application Ser. No. 18/899,639, filed Sep. 27, 2024, invented by Guanhao Shen, and assigned to the assignee hereof.

BACKGROUND

Dynamic random-access memory (DRAM) chips include large arrays of memory cells which represent data as charges stored on tiny capacitors. The charge in the capacitors tends to leak over time, requiring the memory cell to be periodically "refreshed". A refresh operation includes reading the state of the memory cell before it has leaked, and then rewriting it to restore the full amount of charge on the capacitor. The refresh operation needs to be performed within a certain time interval based on the physics of the memory cell. Most DRAM chips sold today are compatible with various double data rate (DDR) DRAM standards promulgated by the Joint Electron Devices Engineering Council (JEDEC), that specifies a refresh interval, known as "$t_{REFI}$". $t_{REFI}$ represents the largest amount of time, on average, within which the charge on the memory cells must be refreshed. During refresh, a memory bank being refreshed is not available for read and write operations. Larger DDR DRAM chip sizes increase the amount of time required to refresh all the memory cells in the chip, and thereby increase the latency of pending read and write commands to banks while their memory cells are being refreshed. For large memory chips, having storage capacities on the order of several Gigabits (Gb), the latency required to refresh the entire memory is also relatively large, such as 300-500 nanoseconds (ns), or about 1000-1600 clock cycles at current memory clock speeds, within each refresh interval.

Figure 1:
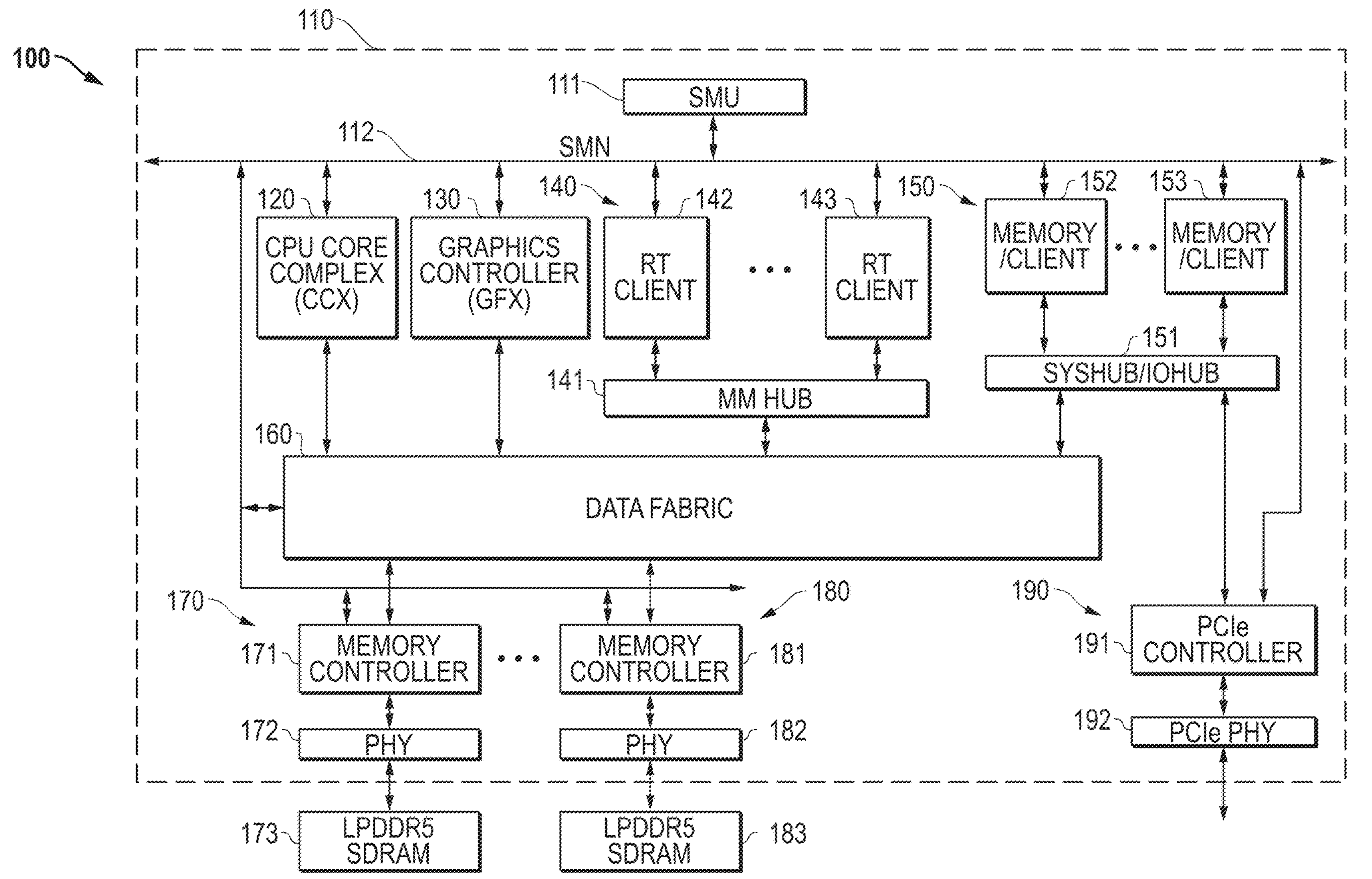
FIG. 1 illustrates in block diagram form a data processing system according to some implementations.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate implementations using suitable forms of indirect electrical connection as well. The following Detailed Description is directed to electronic circuitry, and the description of a block shown in a drawing figure implies the implementation of the described function using suitable electronic circuitry, unless otherwise noted.

DETAILED DESCRIPTION OF ILLUSTRATIVE IMPLEMENTATIONS

Existing memory architectures provide several types of refresh commands. One type of refresh command, known as an all-bank refresh command ($REF_{ab}$), provides the lowest overhead by refreshing the entire memory array in response to a single command, but causes the highest command latency because all pending commands are stalled waiting for all banks to be refreshed. Then, on completion of the $REF_{ab}$ command, the commands have to have their rows activated first, adding more latency.

Another type of refresh command is known as a per bank refresh command ($REF_{pb}$). The $REF_{pb}$ command allows the memory banks to be refreshed individually, as long as all banks are refreshed, on average, within the $t_{REFI}$ window. If the $REF_{pb}$ commands are evenly scattered across the $t_{REFI}$ window, usage of $REF_{pb}$ commands can lower worst-case command latency compared to the $REF_{ab}$ command. However, use of $REF_{pb}$ commands causes greater overall overhead, since all banks must be placed into the idle state before the refresh is performed on a selected bank.

Even finer grain refresh commands are known. For example, double data rate, version four (DDR4) DRAMs introduced a feature known as Fine Granularity Refresh Mode, which added commands that refresh half of a bank and a quarter of a bank, respectively, at a time. Fine Granularity Refresh further improves command latency, but decreases overall efficiency.

There has been a need for a refresh command that is finer granularity than the $REF_{ab}$ command to reduce command latency, but not as small of a granularity as the $REF_{pb}$ or Fine Granularity Refresh commands to maintain efficiency. Recently, a new command known as a "same bank" refresh command ($REF_{sb}$) has been adopted by DDR5 memories to allow a corresponding bank in each of a number of bank groups to be refreshed at the same time, while keeping other banks available for normal read and write accesses.

However, not all memory configurations utilize bank groups, and greater refresh granularity may be desirable. A command suitable for use in these memory configurations has been proposed. It is known as a two-bank refresh command ($REF_{2b}$) and the command refreshes any two banks in the memory while the other banks remain available for reading and writing. However, memory controllers that make good use of this new, medium-granularity refresh command have not yet been developed.

The present implementations relate to a new technique for a memory controller that intelligently schedules accesses to leverage the lower command latencies of these new intermediate-granularity refresh commands such as $REF_{2b}$, while reducing the efficiency losses.

The technique disclosed herein leverages the property that the $REF_{sb}$ command and a similar command known as a 2-bank refresh ($REF_{2b}$) do not require refreshes to be scheduled in any particular order within a refresh interval. The requirement embodied in the $t_{REFI}$ specification only specifies the maximum time during which a memory cell, row, or bank, on average, must be refreshed. By intelligently scheduling the order of the medium granularity refresh commands, such as $REF_{2b}$ based on the current workload in the memory controller's command queue, performance and efficiency of usage of the memory bus can be increased and average command latency can be decreased without the need to favor one factor over the other.

A data processor includes a memory accessing agent for generating memory access requests for a memory that includes a plurality of banks, and a memory controller. The memory controller includes a command queue and a refresh controller. The command queue is for storing the memory access requests. The refresh controller is coupled to the command queue and is operable to select an order of providing multi-bank refresh commands to sets of selected banks of the plurality of banks in the memory in response to lowest-cost estimates of the banks of the memory based on the memory access requests in the command queue. A first example of the lowest-cost estimate would be the raw number of commands in the command queue to each bank, in which the lowest-cost estimate would be the banks having the lowest raw number of commands. A second example of the lowest-cost estimate would be the raw number of commands in the command queue to each bank weighted by their respective quality-of-service indicators, in which the lowest-cost estimate would be the banks having the lowest weighted numbers of commands in the command queue. A third example of the lowest-cost estimate would be the raw number of commands in the command queue to each bank weighted by their respective page states, e.g., open or closed, since accesses to a closed page are lower cost than accesses to an open page. A fourth example of the lowest-cost estimate would be the raw number of commands in the command queue to each bank weighted by their respective access types, e.g., read or write, compared to the current streak being performed, since accesses to non-current access types are lower cost than accesses to the current access type. It should be apparent that these examples are merely examples, and other factors or combinations of these factors can be used.

A data processing system includes a data processor and a memory. The memory is coupled to the data processor, has a plurality of banks, and is operable to execute multi-bank refresh commands by refreshing sets of selected banks of the plurality of banks in response to the multi-bank refresh command. The data processor includes a memory controller having a command queue for storing memory access requests, wherein the memory controller is operable to select an order of providing the multi-bank refresh commands to sets of selected banks of the plurality of banks in the memory in response to lowest-cost estimates of the banks of the memory based on the memory access requests in the command queue.

A method for refreshing a memory having a plurality of banks by a memory controller having a command queue for storing memory access requests includes, during a predetermined time interval, selecting a next set of banks of the memory in response to lowest-cost estimates of the banks of the memory that have not yet been refreshed in a current round based on the memory access requests in the command queue, and generating a multi-bank refresh command for the next set of banks of the memory.

FIG. 1 illustrates in block diagram form a data processing system 100 according to some implementations. Data processing system 100 includes a data processor 110 in the form of an accelerated processing unit (APU) and memory in the form of Low-Power Double Data Rate, version 5, synchronous dynamic random-access memory (LPDDR5 SDRAM) including an LPDDR5 memory 173 and an LPDDR5 memory 183. Many other components of an actual data processing system are typically present but are not relevant to understanding the present disclosure and are not shown in FIG. 1 for case of illustration.

Data processor 110 includes generally a system management unit 111 labelled "SMU", a system management network (SMN) 112, a central processing unit (CPU) core complex 120 labeled "CCX", a graphics controller 130 labeled "GFX", a real-time client subsystem 140, a memory/client subsystem 150, a data fabric 160, memory channels 170 and 180, and a Peripheral Component Interface Express (PCIe) subsystem 190. As will be appreciated by a person of ordinary skill, data processor 110 may not have all of these elements present in every implementation and, further, may have additional elements included therein.

SMU 111 is bidirectionally connected to the major components in data processor 110 over SMN 112. SMN 112 forms a control fabric for data processor 110. SMU 111 is a local controller that controls the operation of the resources on data processor 110 and synchronizes communication among them. SMU 111 manages power-up sequencing of the various processors on data processor 110 and controls multiple off-chip devices via reset, enable and other signals. SMU 111 includes one or more clock sources (not shown), such as a phase locked loop (PLL), to provide clock signals for each of the components of data processor 110. SMU 111 also manages power for the various processors and other functional blocks, and may receive measured power consumption values from CPU cores in CPU core complex 120 and graphics controller 130 to determine appropriate P-states.

CPU core complex 120 includes a set of CPU cores, each of which is a memory accessing agent that is bidirectionally connected to SMU 111 over SMN 112. Each CPU core may be a unitary core only sharing a last-level cache with the other CPU cores, or may be combined with some but not all of the other cores in clusters.

Graphics controller 130 is a memory accessing agent that is bidirectionally connected to SMU 111 over SMN 112. Graphics controller 130 is a high-performance graphics processing unit capable of performing graphics operations such as vertex processing, fragment processing, shading, texture blending, and the like in a highly integrated and parallel fashion. In order to perform its operations, graphics controller 130 requires periodic access to external memory. In the implementation shown in FIG. 1, graphics controller 130 shares a common memory subsystem with CPU cores in CPU core complex 120, an architecture known as a unified memory architecture. Because data processor 110 includes both a CPU and a GPU, it is also referred to as an accelerated processing unit (APU).

Real-time client subsystem 140 includes a set of real-time clients such as representative real time clients 142 and 143, and a memory management hub 141 labeled "MM HUB". Each real-time client is bidirectionally connected to SMU 111 over SMN 112, and to memory management hub 141. Real-time clients in real-time client subsystem 140 could be any type of peripheral controller that requires periodic movement of data, such as an image signal processor (ISP), an audio coder-decoder (codec), a display controller that renders and rasterizes objects generated by graphics controller 130 for display on a monitor, and the like. Each real-time client is also a memory accessing agent.

Memory/client subsystem 150 includes a set of memory elements or peripheral controllers such as representative memory/client devices 152 and 153, and a system and input/output hub 151 labeled "SYSHUB/IOHUB". Each memory/client device is bidirectionally connected to SMU 111 over SMN 112, and to system and input/output hub 151.

Memory/client devices are circuits that either store data or require access to data on an aperiodic fashion, such as a non-volatile memory, a static random-access memory (SRAM), an external disk controller such as a Serial Advanced Technology Attachment (SATA) interface controller, a universal serial bus (USB) controller, a system management hub, and the like.

Data fabric 160 is an interconnect that controls the flow of traffic in data processor 110. Data fabric 160 is bidirectionally connected to SMU 111 over SMN 112, and is bidirectionally connected to CPU core complex 120, graphics controller 130, memory management hub 141, system and input/output hub 151. Data fabric 160 includes a crossbar switch for routing memory-mapped access requests and responses between any of the various devices of data processor 110. It includes a system memory map, defined by a basic input/output system (BIOS), for determining destinations of memory accesses based on the system configuration, as well as buffers for each virtual connection.

Memory channels 170 and 180 are circuits that control the transfer of data to and from LPDDR5 memory 173 and LPDDR5 memory 183. Memory channel 170 is formed by a memory controller 171 and a physical interface circuit 172 labeled "PHY" connected to LPDDR5 memory 173. Memory controller 171 is bidirectionally connected to SMU 111 over SMN 112 and has an upstream port bidirectionally connected to data fabric 160, and a downstream port. Physical interface circuit 172 has an upstream port bidirectionally connected to memory controller 171, and a downstream port bidirectionally connected to LPDDR5 memory 173. Similarly, memory channel 180 is formed by a memory controller 181 and a physical interface circuit 182 connected to LPDDR5 memory 183. Memory controller 181 is bidirectionally connected to SMU 111 over SMN 112 and has an upstream port bidirectionally connected to data fabric 160, and a downstream port. Physical interface circuit 182 has an upstream port bidirectionally connected to memory controller 181, and a downstream port bidirectionally connected to LPDDR5 memory 183.

Peripheral Component Interface Express (PCIe) subsystem 190 includes a PCIe controller 191 and a PCIe physical interface circuit 192. PCIe controller 191 is bidirectionally connected to SMU 111 over SMN 112 and has an upstream port bidirectionally connected to system and input/output hub 151, and a downstream port. PCIe physical interface circuit 192 has an upstream port bidirectionally connected to PCIe controller 191, and a downstream port bidirectionally connected to a PCIe fabric, not shown in FIG. 1. PCIe controller is capable of forming a PCIe root complex of a PCIe system for connection to a PCIe network including PCIe switches, routers, and devices.

In operation, data processor 110 integrates a complex assortment of computing and storage devices, including CPU core complex 120 and graphics controller 130, on a single chip. Most of the features of these controllers are well known and will not be discussed further. However, as will be described in greater detail below, a data processor includes a memory accessing agent that generates memory access requests for a memory that includes a plurality of banks, and a memory controller. The memory controller includes a command queue for storing memory access requests and a refresh controller, coupled to the command queue and operable to select an order of providing multi-bank refresh commands to sets of selected banks of the plurality of banks in the memory in response to lowest-cost estimates of the banks of the memory based on the memory access requests in the command queue. The memory controller ensures that all memory banks are refreshed within the refresh interval ($t_{REFI}$), while intelligently selecting the order of sending the multi-bank refresh commands to improve bus utilization and reduce command latency.

Figure 2:
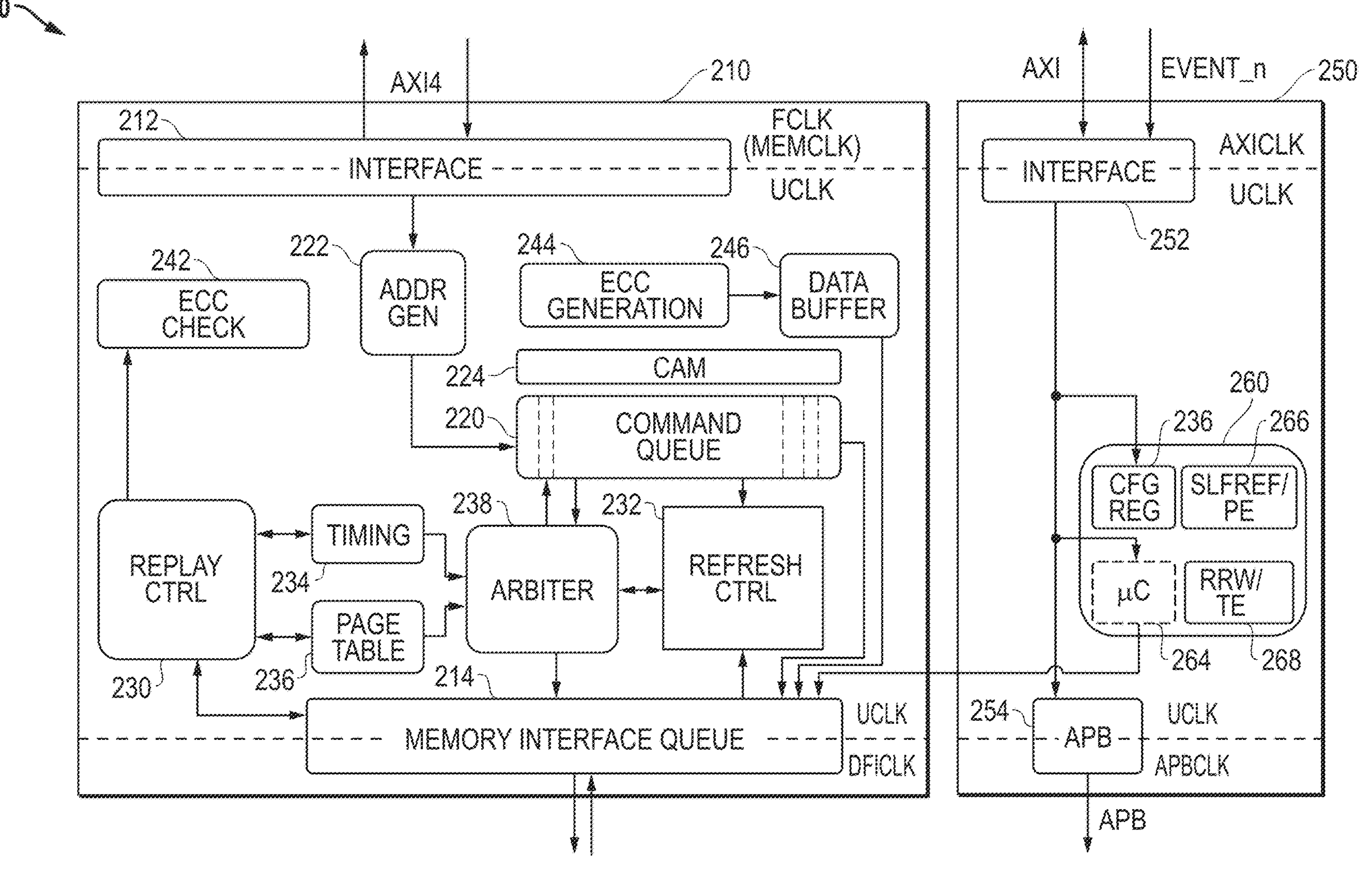
FIG. 2 illustrates in block diagram form a memory controller according to some implementations.

FIG. 2 illustrates in block diagram form a memory controller 200 known in the prior art. Memory controller 200 includes a memory channel controller 210 and a power controller 250. Memory channel controller 210 includes an interface 212, a memory interface queue 214, a command queue 220, an address generator 222, a content addressable memory 224 labelled "CAM", a replay queue 230, a refresh controller 232, a timing block 234, a page table 236, an arbiter 238, an error correction code (ECC) check block 242, an ECC generation block 244, and a data buffer 246 labelled "DB".

Interface 212 has a first bidirectional connection to data fabric 125 over an external bus, and has an output. In memory controller 200, this external bus is compatible with the advanced extensible interface version four specified by ARM Holdings, PLC of Cambridge, England, known as "AXI4", but can be other types of interfaces in other embodiments. Interface 212 translates memory access requests from a first clock domain known as the FCLK (or MEMCLK) domain to a second clock domain internal to memory controller 200 known as the UCLK domain. Similarly, memory interface queue 214 provides memory accesses from the UCLK domain to the DFICLK domain associated with the DFI interface.

Address generator 222 decodes addresses of memory access requests received from data fabric 125 over the AXI4 bus. The memory access requests include access addresses in the physical address space represented in as a normalized address. Address generator 222 converts the normalized addresses into a format that can be used to address the actual memory devices in the memory system, as well as to efficiently schedule related accesses. This format includes a region identifier that associates the memory access request with a particular rank, a row address, a column address, a bank address, and a bank group. On startup, the system BIOS queries the memory devices in the memory system to determine their size and configuration, and programs a set of configuration registers associated with address generator 222. Address generator 222 uses the configuration stored in the configuration registers to translate the normalized addresses into the appropriate format. Command queue 220 is a queue of memory access requests received from the memory accessing agents in data processor 110, such as CPU core complex 120, graphics controller 130, etc. Command queue 220 stores the address fields decoded by address generator 222 as well other address information that allows arbiter 238 to select memory accesses efficiently, including access type and quality of service (QoS) identifiers. Content addressable memory 224 includes information to enforce ordering rules, such as write after write (WAW) and read after write (RAW) ordering rules.

Replay queue 230 is a temporary queue for storing memory accesses picked by arbiter 238 that are awaiting responses, such as address and command parity responses, write cyclic redundancy check (CRC) responses for DDR4 DRAM or write and read CRC responses for GDDR5 DRAM. Replay queue 230 accesses ECC check block 242 to determine whether the returned ECC is correct or indicates an error. Replay queue 230 allows the accesses to be replayed in the case of a parity or CRC error of one of these cycles.

Refresh controller 232 is a hardware circuit that includes various circuitry such as timers, counters, state machines, registers, digital logic, and the like to implement same bank refresh commands, as well as various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. In general, refresh controller 232 generates refresh commands periodically to prevent data errors caused by leaking of charge off storage capacitors of memory cells in DRAM chips and satisfies the $t_{REFI}$ parameter. In addition, refresh controller 232 periodically calibrates ZQ to prevent mismatch in on-die termination resistance due to thermal changes in the system. Refresh controller 232 also decides when to put DRAM devices in different power down modes.

Refresh controller 232 has an input connected to command queue 220 and is operable to select an order of providing multi-bank refresh commands to sets of selected banks of the banks of the memory in response to lowest-cost estimates of the banks in the memory based on the memory access requests in the command queue. These operations will be described in greater detail below.

Arbiter 238 is bidirectionally connected to command queue 220 and is the heart of memory channel controller 210. It improves efficiency by intelligent scheduling of accesses to improve the usage of the memory bus. Arbiter 238 uses timing block 234 to enforce proper timing relationships by determining whether certain accesses in command queue 220 are eligible for issuance based on DRAM timing parameters. For example, each DRAM has a minimum specified time between activate commands to the same bank, known as "$t_{RC}$". Timing block 234 maintains a set of counters that determine eligibility based on this and other timing parameters specified in the JEDEC specification, and is bidirectionally connected to replay queue 230. Page table 236 maintains state information about active pages in each bank and rank of the memory channel for arbiter 238, and is bidirectionally connected to replay queue 230.

In response to write memory access requests received from interface 212, ECC generation block 244 computes an ECC according to the write data. Data buffer 246 stores the write data and ECC for received memory access requests. It outputs the combined write data/ECC to memory interface queue 214 when arbiter 238 picks the corresponding write access for dispatch to the memory channel.

Power controller 250 includes an interface 252 to an advanced extensible interface, version one (AXI), an APB interface 254, and a power engine 260. Interface 252 has a first bidirectional connection to the SMN, which includes an input for receiving an event signal labeled "EVENT_n" shown separately in FIG. 2, and an output. APB interface 254 has an input connected to the output of interface 252, and an output for connection to a PHY over an APB. Power engine 260 has an input connected to the output of interface 252, and an output connected to an input of memory interface queue 214. Power engine 260 includes a set of configuration registers 262, a microcontroller (μC) 264, a self refresh controller 266 labelled "SLFREF/PE", and a reliable read/write training engine 268 labelled "RRW/TE". Configuration registers 262 are programmed over the AXI bus, and store configuration information to control the operation of various blocks in memory controller 200. Accordingly, configuration registers 262 have outputs connected to these blocks that are not shown in detail in FIG. 2. Self refresh controller 266 is an engine that allows the manual generation of refreshes in addition to the automatic generation of refreshes by refresh controller 232. Reliable read/write training engine 268 provides a continuous memory access stream to memory or I/O devices for such purposes as DDR interface read latency training and loop-back testing.

Memory channel controller 210 includes circuitry that allows it to pick memory accesses for dispatch to the associated memory channel. In order to make the desired arbitration decisions, address generator 222 decodes the address information into predecoded information including rank, row address, column address, bank address, and bank group in the memory system, and command queue 220 stores the predecoded information. Configuration registers 262 store configuration information to determine how address generator 222 decodes the received address information. Arbiter 238 uses the decoded address information, timing eligibility information indicated by timing block 234, and active page information indicated by page table 236 to efficiently schedule memory accesses while observing other criteria such as Qos requirements. For example, arbiter 238 implements a preference for accesses to open pages to avoid the overhead of precharge and activation commands required to change memory pages, and hides overhead accesses to one bank by interleaving them with read and write accesses to another bank. In particular during normal operation, arbiter 238 may decide to keep pages open in different banks until they are required to be precharged prior to selecting a different page.

Figure 3:
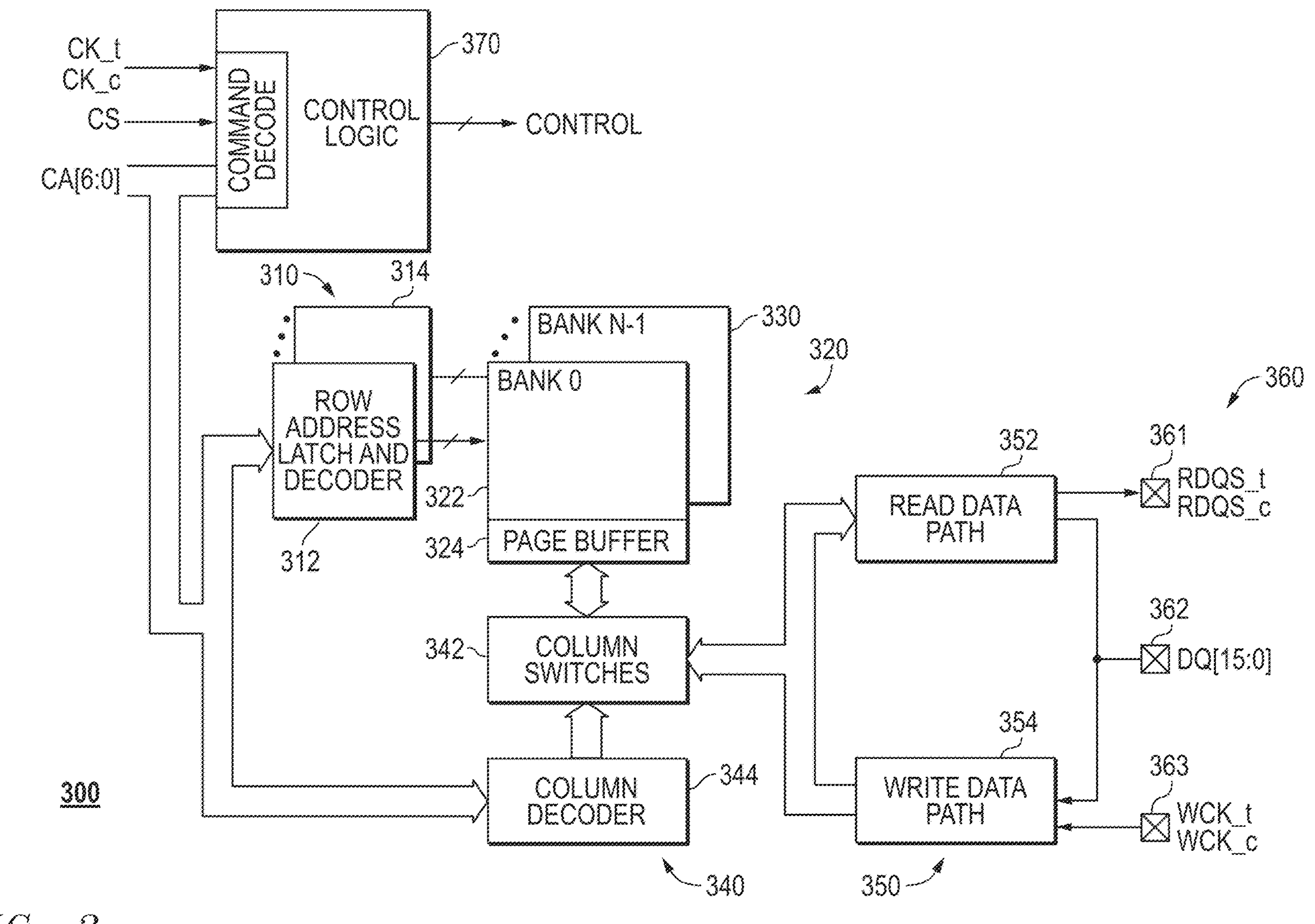
FIG. 3 illustrates in block diagram form a memory suitable for use with the memory controller of FIG. 2 according to some implementations.

FIG. 3 illustrates in block diagram form a memory 300 suitable for use with memory controller 200 of FIG. 2 according to some implementations. Memory 300 supports the new $REF_{2b}$ command, but otherwise operates according to the JEDEC LPDDR5 standard. Memory 300 includes generally a row path 310, a set of memory banks 320, a column circuit 340, a data path 350, a set of data path terminals 360, and a control logic circuit 370.

Row path 310 includes a row address latch and decoder for each bank such as a row address latch and decoder 312 for a first bank labeled "BANK 0" and a row address latch and decoder 314 for a last bank labeled "BANK N−1". Row path 310 has a set of inputs for receiving an address portion of a set of command and address signals labeled "CA[6:0]", and a set of outputs providing decoded row select signals and a bank select signal for the selected bank.

Each one of memory banks 320 includes an associated memory array and a page buffer such as representative memory array 322 having a page buffer 324 for BANK 0, and a memory bank 330 having a page buffer for BANK N−1. Each of the N memory banks 320 has inputs connected to the set of outputs of a corresponding row address latch and decoder, and a bidirectional data input/output port connected to the corresponding page buffer.

Column circuit 340 includes a set of column switches 342 and a column decoder 344. Set of column switches 342 is bidirectionally connected to the page buffers of memory banks 320, and has a set of inputs for receiving column selection signals. Column decoder 344 has a set of inputs for receiving a column address conducted on the CA[6:0] inputs for selecting a column of one of the eight banks selected by a bank address, and a set of outputs connected to the inputs of column switches 342.

Data path 350 includes a read data path 352 and a write data path 354. Read data path 352 has a set of inputs connected to column switches 342, and a set of outputs connected to data and read data strobe signal pads. Write data path 354 has a set of inputs connected to the data pads and write clock signals, and a set of outputs connected to column switches 342.

Data path terminals 360 include differential read data strobe input signals labelled "RDQS_t" and "RDQS_c" output on terminals 361 along with output data conducted on data input/output pads 362 during read cycles, and differential write clock input signals labelled "WCK_t" and "WCK_c" received on input terminals 363 along with output data conducted on data input/output pads 362 during write cycles.

Control logic circuit 370 has inputs for receiving the command portion of command and address signals CA[6:0] synchronously with a differential command clock signal "CK_t" and "CK_c" received on corresponding clock input signal lines, an input signal line for receiving a chip select signal labelled "CS", and a set of output line labelled "CONTROL" that are distributed across memory 300 to control the memory for various operations such as read cycles, write cycles, precharge cycles, refresh eyeles, and the like.

In operation, memory 300 is generally compatible with and operates according to the low-power double data rate, version five (LPDDR5) standard published by the Joint Electron Device Engineering Council (JEDEC). Since this operation is well-known and documented, it will not be discussed in detail. However, memory 300 additionally supports the new $REF_{2b}$ command. $REF_{2b}$ is a medium-granularity refresh command that is appropriate for a memory that does not include bank groups, and allows any two banks in memory banks 320 to be refreshed concurrently. Thus, control logic circuit 370 includes a command decoder that decodes this new command in addition to the other LPDDR5 commands, and activates certain ones of the CONTROL signals to implement the command.

In particular, memory 300 allows any two banks of memory banks 320 to be refreshed concurrently using the $REF_{2b}$ command. The $REF_{2b}$ specifies the two banks that are being selected. The only requirement is that all memory banks must be refreshed within the refresh interval $t_{REFI}$, and refresh controller 232 of memory controller 200 ensures this requirement is met.

As noted above, refresh controller 232 recursively selects next sets of banks of the memory that have not yet been refreshed in a current round, in which a current round corresponds to refreshing all the memory banks within the refresh interval $t_{REFI}$. It does so by examining the commands in command queue 220 and selecting the two banks that are estimated to be the lowest-cost accesses among the banks that have not yet been picked in the current round. By using this selection process, memory controller 200 leverages the opportunity to pick memory banks for refresh in any order during a round of picking.

The two lowest-cost banks are generally the two banks that will cause the least disruption in the current window of commands stored in command queue 220. While the command mix may change over time, the mix of commands in command queue 220 constitutes an unbiased estimate of future commands that are being generated by active program threads running on the memory accessing agents, e.g., CPU core complex 120 and graphics controller 130. For example, if command queue 220 stores no commands for a particular bank, there would be no estimated commands among the commands in command queue 220 stalled during the pendency of a REF2b command. Thus, the raw number of commands to each memory bank is a rough approximation of cost. However, other factors may be used in various combinations to estimate the cost of refreshing a particular bank.

Another factor is a quality-of-service indicator for commands, and refresh controller 232 can form the lowest-cost estimates based on a sum of memory access requests in the command queue for each of the banks of the memory weighted by their respective quality-of-service indicators. For example, some data accessing agents such as CPU cores in CPU core complex 120 generate instruction fetches that are latency sensitive because failure to perform the fetch within a period of time can result in program stalling. On the other hand, some accesses such as graphics accesses generated by graphics controller 130 are bandwidth-sensitive because graphics controller 130 must process a large amount of data within a time window to support a display refresh rate. So, for example, these accesses would be assigned medium priority, but then the memory access requests would be subject to elevation in priority if not completed within a certain amount of time. Still other accesses are low priority, such as input/output accesses from a keyboard or mouse.

Yet another factor is page state. Arbiter 238 schedules accesses to open pages, i.e., rows in a memory bank whose contents are stored in the page buffer, before accesses to closed pages to increase efficiency. Thus, memory accesses to closed pages are lower cost than memory accesses to open pages because of the foregone opportunity of performing the accesses to the open pages while the page is still open before all pages are closed for the multi-bank refresh.

Still another factor is access type, either read or write. Because of the relatively high turn-around time for a DDR memory to change from reads to writes and vice versa, accesses to the cross mode (writes during a streak of reads or reads during a streak of writes) are lower cost than accesses to the current mode.

It should be apparent in consideration of these factors that one, some, or all of them could be used to form the lowest-cost estimate. Other factors that relate to the cost of forgoing accesses to a given memory bank can be used as well. Moreover, there is a tradeoff between circuit complexity, size, and evaluation time to increase the accuracy of the lowest-cost estimate such that different estimates will be appropriate in different data processing systems.

Figure 4:
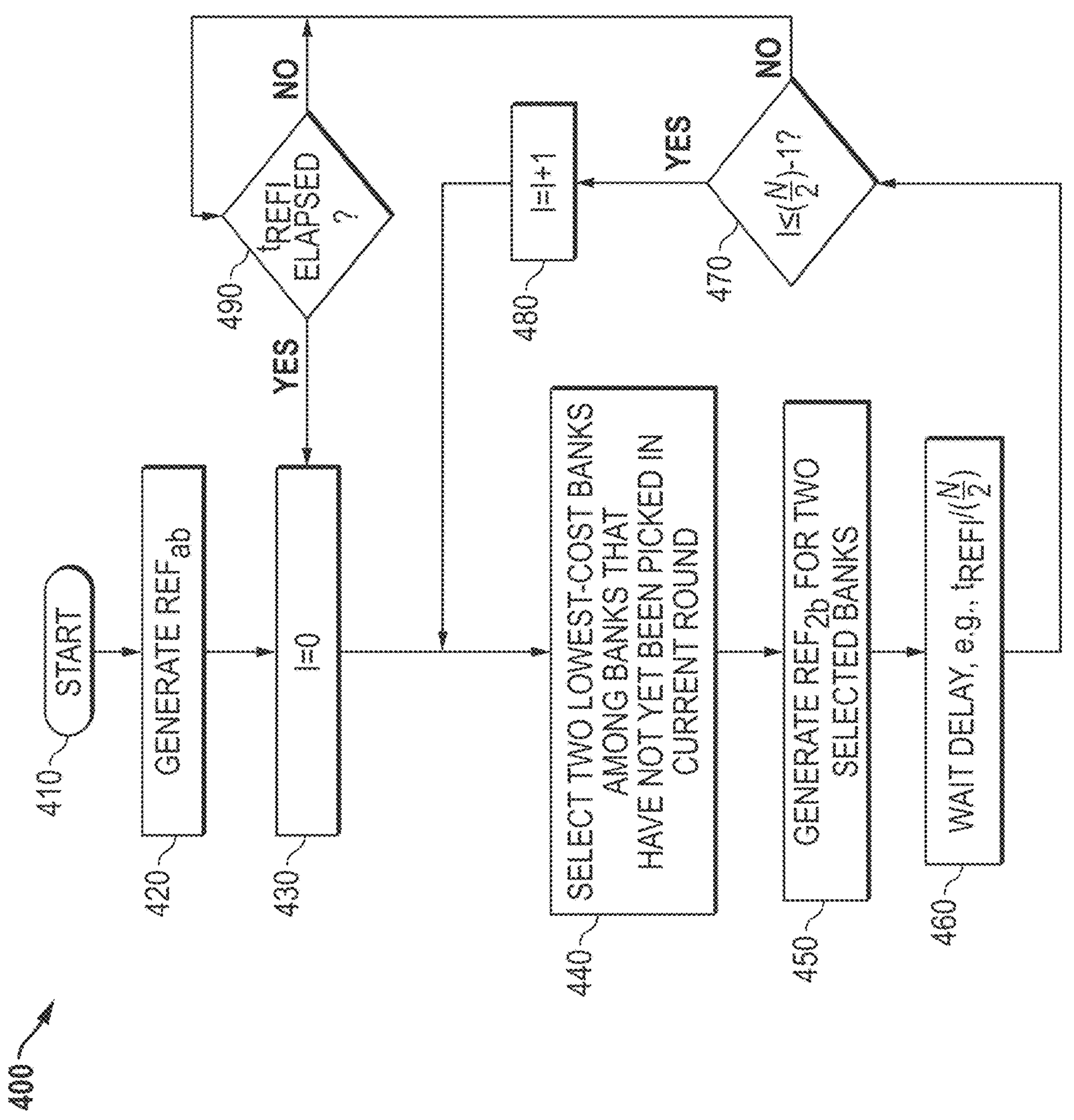
FIG. 4 illustrates a flow chart of a method for refreshing a memory by the refresh controller of FIG. 2 according to some implementations.

FIG. 4 illustrates a flow chart of a method 400 for scheduling two-bank refreshes by refresh controller 232 of FIG. 2 according to some implementations. Method 400 starts in an action box 410. For example, action box 410 could correspond to system startup or cold or warm boot.

In an action box 420, refresh controller 232 generates an all-bank refresh command (REFab). The REFab command ensures that the memory starts from a known state for determining the refresh interval in which all banks have been refreshed.

In an action box 430, refresh controller 232 initializes a loop counter by setting a loop index I to zero.

In an action box 440, refresh controller 232 selects the two lowest-cost banks among the banks that have not yet been picked in the current round. Since every memory cell must be refreshed, on average, once every $t_{REFI}$, every bank will be picked once in a round that lasts about $t_{REFI}$.

In an action box 450, refresh controller 232 generates the $REF_{2b}$ command for these two selected banks, and sends the $REF_{2b}$ command to arbiter 238 for insertion into the command stream. Arbiter 238 sends the $REF_{2b}$ command to memory interface queue 214, which in turn sends it to the memory through the PHY.

In an action box 460, refresh controller 232 waits a delay before continuing. In a system with N banks, this delay time can be equal to $t_{REFI}/(N/2)$ to evenly spread the refresh overhead over the $t_{REFI}$ period. In other implementations, the delay could be a lower amount as long as the total delay is sufficient to cause all banks to be refreshed within the $t_{REFI}$ interval.

In a decision box 470, refresh controller 232 evaluates whether not all refresh groups have been refreshed in the current round, i.e., whether an internal bank counter index I is less than or equal to (N/2)−1. If the condition I≤(N/2)−1 is true, then the round continues and flow proceeds to an action box 480. In action box 480, the loop counter index is incremented by 1, and flow returns to action box 440. If the condition I≤(N/2−1) is not true, i.e., the REF2b operation has occurred for N/2 times, then flow continues to a decision box 490.

Decision box 490 determines whether the $t_{REFI}$ period has elapsed, i.e., whether the current round is over. If not, then flow returns to decision box 490. If so, then flow continues to action box 430, loop index I is reset to 0, and a new round begins.

In the exemplary implementation, the steps of method 400 are implemented in hardware circuitry. This circuitry is not shown in detail, but the construction of the described functions in hardware circuitry would be readily apparent to those of ordinary skill in the art. For example, the circuitry could include timers, counters, state machines, registers, digital logic, and the like to implement method 400.

Thus, a data processor, data processing system, and method have been described that can be used to improve performance thereof when using a multi-bank refresh command such as the $REF_{2b}$ command. A memory controller schedules multi-bank refresh commands to the banks of the memory in an order that achieves better efficiency given the current workload of the memory controller. Thus, it leverages the assumption that the currently visible workload forms an unbiased estimate of the workload in the near future. The memory controller picks the lowest-cost banks for refresh among the banks that have not yet been refreshed in the current round by examining at the memory access requests currently stored in the command queue, and optionally, the commands being picked by the arbiter. For example, the lowest-cost banks can be estimated as the banks with the fewest number of commands in the command queue. In another example, the lowest-cost banks can be estimated as the banks with the fewest number of commands in the command queue weighted by a respective quality-of-service indicator, a respective page state, or by a current streak type. Once the lowest-cost banks have been selected, the memory controller sends the multi-bank refresh command for this set of banks to the memory.

While particular implementations have been described, various modifications of these implementations will be apparent to those skilled in the art. For example, while the exemplary multi-bank refresh command refreshes two banks at a time using the $REF_{2b}$ command, other numbers greater than one and less than the total number of banks in the memory can be chosen in other implementations. While various examples were described above for an LPDDR5 DRAM that has been modified to support the multi-bank refresh commands, other specific memories can be modified to support the multi-bank refresh commands. A memory controller may observe other timing constraints besides the $t_{REFI}$ interval described above. The memory controller may simultaneously support other refresh commands of different granularities, including all bank refresh, per bank refresh, and Fine Granularity Refresh, provided that all rows in the memory system are refreshed within tREFI on average.

Accordingly, it is intended by the appended claims to cover all modifications of the disclosed implementations that fall within the scope of the disclosed implementations.

What is claimed is:

1. A data processor comprising:

a memory accessing agent for generating memory access requests for a memory that includes a plurality of banks, and a memory controller comprising:

a command queue for storing the memory access requests; and a refresh controller coupled to the command queue and operable to select an order of providing multi-bank refresh commands to sets of selected banks of the plurality of banks in the memory in response to lowest-cost estimates of the banks of the memory based on a number of memory access requests in the command queue for each of the plurality of banks of the memory.

2. The data processor of claim 1, wherein the refresh controller is operable to pick sets of selected banks among banks that have not yet been picked in a current refresh interval, and to generate a corresponding multi-bank refresh commands.

3. The data processor of claim 1, wherein:

the multi-bank refresh commands comprise two-bank refresh commands; and the sets of selected banks comprise sets of two banks.

4. The data processor of claim 1, wherein the refresh controller forms the lowest-cost estimates based on a sum of memory access requests in the command queue for each of the plurality of banks of the memory weighted by a quality-of-service indicator.

5. The data processor of claim 1, wherein the refresh controller forms the lowest-cost estimates based on a sum of memory access requests in the command queue for each of the plurality of banks of the memory weighted by a page state, wherein the page state is one of an open page or a closed page.

6. The data processor of claim 1, wherein the refresh controller forms the lowest-cost estimates based on a sum of memory access requests in the command queue for each of the plurality of banks of the memory weighted by a current streak type, wherein the current streak type is one of read and write.

7. The data processor of claim 1, wherein the refresh controller forms the lowest-cost estimates based on a sum of memory access requests in the command queue for each of the plurality of banks of the memory weighted by a plurality of factors.

8. A data processing system comprising:

a data processor; and a memory coupled to the data processor, having a plurality of banks and operable to execute multi-bank refresh commands by refreshing sets of selected banks of the plurality of banks in response to each multi-bank refresh command, wherein the data processor comprises a memory controller having a command queue for storing memory access requests, wherein the memory controller is operable to select an order of providing the multi-bank refresh commands to sets of selected banks of the plurality of banks in the memory in response to lowest-cost estimates of the banks of the memory based on a number of memory access requests in the command queue for each of the plurality of banks of the memory.

9. The data processing system of claim 8, wherein the memory controller is operable to pick a set of selected banks among banks that have not yet been picked in a current refresh interval, and to generate corresponding multi-bank refresh commands.

10. The data processing system of claim 8, wherein:

the multi-bank refresh commands comprise two-bank refresh commands; and the sets of selected banks comprise sets of two banks.

11. The data processing system of claim 8, wherein the memory controller forms the lowest-cost estimates based on a sum of pending memory access requests in the command queue for each of the plurality of banks of the memory weighted by a quality-of-service indicator.

12. The data processing system of claim 8, wherein the memory controller forms the lowest-cost estimates based on a sum of pending memory access requests in the command queue for each of the plurality of banks of the memory weighted by a page state, wherein the page state is one of an open page or a closed page.

13. The data processing system of claim 8, wherein the memory controller forms the lowest-cost estimates based on a sum of pending memory access requests in the command queue for each of the plurality of banks of the memory weighted by a current streak type, wherein the current streak type is one of read and write.

14. The data processing system of claim 8, wherein the memory controller forms the lowest-cost estimates based on a sum of pending memory access requests in the command queue for each of the plurality of banks of the memory weighted by a plurality of factors.

15. A method for refreshing a memory having a plurality of banks by a memory controller having a command queue for storing memory access requests, comprising:

during a predetermined time interval:

forming lowest-cost estimates based on numbers of memory access requests in the command queue for corresponding banks;

selecting a next set of banks of the memory in response to the lowest-cost estimates of the banks of the memory that have not yet been refreshed in a current round based on the memory access requests in the command queue; and generating a multi-bank refresh command for the next set of banks of the memory.

16. The method of claim 15, wherein generating the multi-bank refresh command comprises:

generating a two-bank refresh command.

17. The method of claim 15, wherein forming further comprises weighting the numbers of memory access requests is based on one of more of:

a quality of service indicator;

a page state indicator, wherein the page state indicator is one of an open page or a closed page; and a current streak type, wherein the current streak type is one of read and write.

* * * * *